United States Patent
Kessler et al.

[11] Patent Number: 5,854,651
[45] Date of Patent: Dec. 29, 1998

[54] OPTICALLY CORRECTING DEVIATIONS FROM STRAIGHTNESS OF LASER EMITTER ARRAYS

[75] Inventors: David Kessler; Douglass Lane Blanding, both of Rochester, N.Y.

[73] Assignee: Eastman Kodak Company, Rochester, N.Y.

[21] Appl. No.: 659,469

[22] Filed: May 31, 1996

[51] Int. Cl.[6] .................................................. G02B 26/08
[52] U.S. Cl. ........................................ 347/241; 359/223
[58] Field of Search .................................. 359/223, 225, 359/622, 623, 833, 837; 347/241, 242, 244, 248

[56] References Cited

U.S. PATENT DOCUMENTS

| | | | |
|---|---|---|---|
| 4,728,965 | 3/1988 | Kessler et al. ................. | 358/296 X |
| 5,111,325 | 5/1992 | DeJager ........................... | 359/206 |
| 5,629,791 | 5/1997 | Harrigan ......................... | 359/223 |

Primary Examiner—Edward H. Tso
Attorney, Agent, or Firm—Nelson Adrian Blish

[57] ABSTRACT

An optical apparatus for correcting deviations from straightness of an array of laser emitters in generally aligned positions along an array direction includes a corrector for aligning the light beam paths in a cross-array direction. A lenslet array shaping optics is provided to direct the light of individual emitters to individual associated regions of the corrector. The corrector may include (1) an array of plane parallel plates individually tiltable to displace the beam by an amount to align the light beam paths in a cross-array direction, (2) a semicylindrical-shaped tray adapted to receive the plane parallel plates such that the plates may be positioned at various angular orientations relative to the light beam path, (3) an array of mirrors associated with a respective one of the beams at an angle to reflect the beam along a folded beam path, (4) an array of lenslets movable in the cross-array direction in the path of an associated beam so as to displace the associated beam by an amount to align the beam paths in a cross-array, or (5) a small diameter rod lens parallel to the array direction and forcibly distorted in the cross-array direction in the path of the associated beam so as to displace the associated beam by an amount to align the beam paths in a cross-array direction.

9 Claims, 10 Drawing Sheets

OPTICALLY CORRECTING DEVIATIONS FROM STRAIGHTNESS OF LASER EMITTER ARRAYS

CROSS REFERENCE TO RELATED APPLICATIONS

Reference is made to commonly assigned, co-pending U.S. patent applications Ser. No. 07/986,207 filed on Dec. 7, 1992; Ser. No. 08/261,370 filed on Jun. 16, 1994; and entitled OPTICAL COMPENSATION FOR LASER EMITTER ARRAY NON-LINEARITY filed by M. Harrigan concurrently herewith.

BACKGROUND OF THE INVENTION

1. Technical Field

The present invention relates generally to linear arrays of laser emitters used in printers to expose photosensitive media.

2. Background Art

In laser thermal printers, the optical power of lasers is used to affect the photosensitive media. The printing can take place on dye transfer media, ablation media, photo resist media, or any other photosensitive media. High power is needed to enhance the printing speed of laser thermal printers. One technique for achieving high power in a laser thermal printer is to use a monolithic array of diode laser emitters.

A laser array consists of an array of emitters arranged on a line which is typically 10 mm long. Each emitter in the array has an emitting aperture length between about 4 microns to 200 microns in the direction along the line of emitters (herein called the "array direction"). In the cross-array direction, which is perpendicular to the array direction, the emitting apertures are only 0.5 micron to 1 micron wide. Therefore, the emission profile has a large divergence in the cross-array direction of about 30° measured at the full width at half the maximum of the intensity. The emission in the array direction is usually only about 10° measures at the full width at half the maximum of the intensity.

U.S. Pat. No. 4,804,975, which issued to K. Yip on Feb. 14, 1989, discloses a thermal dye transfer apparatus which includes such a monolithic array of diode laser emitters that illuminate a dye carrying donor medium. The donor medium absorbs the heat from the laser light, and the dye is transferred from the donor medium to the receiving member. The diode laser emitters in the array are independently modulated. When the array of laser emitters is directly imaged in such a system onto the media, cross-array emitter position errors are transferred to the media.

In such an application, it is important to have the printing spots lie on a well defined line. Otherwise, artifacts will be introduced into the document. FIG. 1 shows an array of spots tilted by an angle α on a medium wrapped around a drum. Raster lines 10, 12, 14, and 16 are formed from the spots. Spots 18 and 20 are on an acceptable line, while spot 22 is displaced from its desired position.

In this case the array of printing spots is tilted by angle α to provide raster lines 10, 12, 14, etc. with a predetermined pitch. The deviation of printing spot 22 from a straight line results in an axial displacement of its raster line along the printing drum. This uneven spacing of the raster lines is a source of printing artifacts such as the one called "banding." If the printing head is not tilted such that α=0, the deviations from straightness can be cured electronically for a particular writing plane by using different time delays for each of the printing spots. However, when the medium surface is shifted from this particular plane (such as by the use of a receiver sheet of different thickness), the delays may need to be adjusted, or the position errors will be evident. It is thus important in multi-spot laser printers to have the printing spots lie on a straight line and to preserve this straightness over a certain depth of focus along the optical axis.

Typically, the printing spots are created by an optical system which makes a magnified image of the laser emitters. A normal laser diode emitter in the array has an aperture of approximately 4 microns to 200 microns in the array direction by 0.5 micron to 1 micron in the cross-array direction. Printing spots ordinarily may lie in a range from about 5 microns to about 50 microns in size: so the optical system will need to produce a magnification from 10× to 100×.

Some laser manufacturing processes result in laser emitters having displacements from a perfect line. The magnitude of these errors can easily be 5 microns, which is much larger than the spot itself. With the optical system magnifying the spots by such a large amount in the cross-array direction as described above, the displacement error is also magnified by the same amount. This causes a large displacement of the printing spots compared to the actual spot dimension. Printing with such a non-straight line of spots will not produce acceptable images. The perpendicular deviations of the laser emitters from an ideal line are referred to herein as "cross-array emitter position" errors.

There is however a way to optically correct for this laser displacement error and to provide a straight line of printing spots at the media, even in the presence of significant cross-array emitter position errors. This method is based on imaging in the cross-array direction of the far field of the laser (a plane very far from the laser) onto the media instead of imaging the laser itself (the near field). This method can be understood by observing that, in the far field, the beams will spread and become large. As shown in FIG. 2, a lenslet array 27 with lenses distinct from each other in the array direction images at the far field. Any emitter deviations from straightness of several microns in the cross-array direction become small compared to the beam size, and one can say that, in the far field, the beams lie on a substantially straight line because the cross-array emitter position errors are small compared the beam sizes.

The far field can be brought to a finite distance with the use of a lens with power in the cross-array direction. FIG. 3 shows a section of a laser diode array in the cross-array direction. Laser emitters 24 and 26 are displaced due to cross-array emitter position error. A lens 28 is placed at a distance of $f_{28}$ from the emitter. The far field is found at the back focal plane (the second principal focus) 30 of lens 28. At the back focal plane, the array is therefore straight. However the beams from the different laser emitters emerge from this plane at different angles. The cross-array emitter position errors are transformed into angular errors. If the cross-array emitter position error for say emitter 24 is ϵ, then the angular error at plane 30 is given simply by $\epsilon/f_{28}$.

Another way to describe the straightening of the array at the back focal plane of the lens 28 is to note that the rays at the center of the beams from the different laser emitters of the array all start perpendicular to the emitting surface so they are all parallel to each other. It is well known that parallel rays entering a lens will intersect at the back focal plane of the lens; thus the emitter array is straightened at this plane because the center rays of the laser emitters intersect there. The back focal plane can then be imaged by other optics onto the media with the printing spots forming a straight line.

Commonly assigned, co-pending U.S. patent application Ser. No. 07/986,207, filed Dec. 7, 1992, discloses a monolithic array where each of the diode laser emitters in the array is independently modulated, and lenslets are used to closely pack the printing spots at the media. In this application, the cross-array emitter position errors are corrected by imaging the far field of the laser emitters onto the media in the cross-array direction.

Commonly assigned, co-pending U.S. patent application Ser. No. 08/261,370 entitled "Multi spot digital printer using laser and laser array" filed on Jun. 16, 1994, discloses the use of diode laser arrays to illuminate an array of spatial modulators, which are then imaged onto the receiver medium to produce an array of printing spots. In a printer of this kind, it is common to mix the light from the laser emitters in the array so as to provide improved illumination uniformity at the modulator and to protect against a defective or a dead emitter in the array affecting the print. To avoid light losses at the spatial modulators, one should have a straight magnified emitter image at the modulators. This can be accomplished with the method disclosed in aforementioned application Ser. No. 07/986,207 by making the modulator geometrically conjugate to the far field of the laser emitters in the cross-array direction of the beam.

In applications requiring high power throughput such as a thermal dye transfer process as disclosed in application Ser. No. 07/986,207, it is not sufficient to have a straight line of printing spots at an image receiver medium. While the back focal plane imaging technique shown in FIG. 3 produces a straight line of spots, it does not completely compensate for cross-array emitter position errors. As can be seen from FIG. 3, the cross-array emitter position errors are converted into angular errors of the beams after back focal plane 30. These angular errors may be further increased as the light progresses down the optical system. If the angular errors become too large, light loss may result, and the power throughput reduced by an unacceptable amount.

This light loss is more apparent in the system using modulators disclosed in application Ser. No. 08/261,370. In this system, the back focal plane of the first lens is imaged onto a modulator, which can be envisioned as an array of apertures. When such a back focal plane is imaged onto a modulator with a reduced magnification, the angular errors of the beams at the modulator are magnified. This fact must be so to preserve the Langrange Invariant. Magnified angular errors place a larger burden on the following lens numerical aperture, which must be enough to accept these magnified angles. Otherwise the optical system after such a modulator will vignette light from laser emitters which have large cross-array emitter position errors.

Even if the light beams pass through a post modulator optical system unvignetted, the depth of focus at an image receiving medium will be smaller than that achieved with no cross-array emitter position errors. The focal depth is reduced because, when large beam angles enter an image receiving medium, the increased spreading of the light causes printing spots to grow to an unacceptable size with a smaller focal shift.

Hence, un-corrected cross-array emitter position errors have at least the following three adverse effects: (1) a non-straight line of printing spots, (2) light losses by vignetting of the beams, and (3) reduced focal depth at the printing medium making the system more difficult to manufacture. Thus, the prior art does not provide means for fully correcting the non straightness of the diode laser array.

DISCLOSURE OF THE INVENTION

It is an object of the present invention to provide for correction of the cross-array position errors of emitters of a straight array so that the performance of a printhead will be essentially equivalent to the performance achieved with a straight emitter array without cross-array position errors.

It is another object of the present invention to provide for the correction of the cross-array position errors of emitters of a straight array so that the performance of a printhead will be essentially equivalent to the performance achieved with a straight emitter array without cross-array position errors at more than one plane and which reduces the Lagrange Invariant of the laser array in a cross-array direction.

It is another object of the present invention to provide for removing or greatly reducing not only the cross-array emitter position errors, but also the angular errors not removed by far field imaging of the emitter array.

It is another object of the present invention to provide for removing or greatly reducing the cross-array emitter position errors and the angular errors of the emitter array by use of tilted plane parallel plates or lenslets components with displacements or tilts to shift beams passing through each component.

It is another object of the present invention to provide for removing or greatly reducing the cross-array emitter position errors and the angular errors for beams that may not be well separated.

It is another object of the present invention to provide for removing or greatly reducing the cross-array emitter position errors and the angular errors for beams that may not be well separated by means of a component that may be adjusted to remove the cross-array emitter position error of each emitter in the array without affecting beams from other emitters.

According to a feature of the present invention, an optical apparatus for correcting deviations from straightness of an array of laser emitters in generally aligned positions along an array direction includes a corrector in the light beam paths for aligning the light beam paths in a cross-array direction, thereby to correct for any deviation of the laser emitters from the straight, array direction line of the laser emitters.

According to another feature of the present invention, shaping optics is provided between the array of laser emitters and the corrector to direct the light of individual emitters to individual associated regions of the corrector. The shaping optics may be an array of lenslets having power in at least the array direction, with each lenslet positioned to receive the beam from a corresponding emitter and to image the corresponding emitter onto a plane to form uncorrected printing spots.

According to another feature of the present invention, the corrector may include an array of plane parallel plates individually tiltable to displace the beam by an amount to align the light beam paths in a cross-array direction. The plane parallel plates may be hinged along one side, and adapted to be pivoted about their respective hinged sides.

According to another feature of the present invention, the corrector may include a semicylindrical-shaped tray adapted to receive the plane parallel plates such that the plates may be positioned at various angular orientations relative to the light beam path. A plurality of adjusting screws may be associated with the plane parallel plates and adapted to position the plates at said various angular orientations.

According to another feature of the present invention, the corrector may include an array of mirrors, each mirror of the array being associated with a respective one of the beams at an angle to reflect the beam along a folded beam path, the angle being adjustable whereby the reflected beam is displaced by an amount to align the folded beam paths in a cross-array direction.

According to another feature of the present invention, the corrector may include an array of lenslets, each lenslet of the array being associated with a respective one of the beams and being movable in the cross-array direction in the path of the associated beam so as to displace the associated beam by an amount to align the beam paths in a cross-array. The lenslets may be movable by displacement in the cross-array direction, or by tilting in the cross-array direction.

According to another feature of the present invention, the corrector may include a small diameter rod lens parallel to the array direction. The rod lens may define a front focal plane with the array of laser emitters positioned at the front focal plane of the rod lens. The rod lens may be forcibly distorted in the cross-array direction in the path of the associated beam so as to displace the associated beam by an amount to align the beam paths in a cross-array direction.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

The present description will be directed in particular to elements forming part of, or cooperating more directly with, apparatus in accordance with the present invention. It is to be understood that elements not specifically shown or described may take various forms well known to those skilled in the art.

Figure 4:
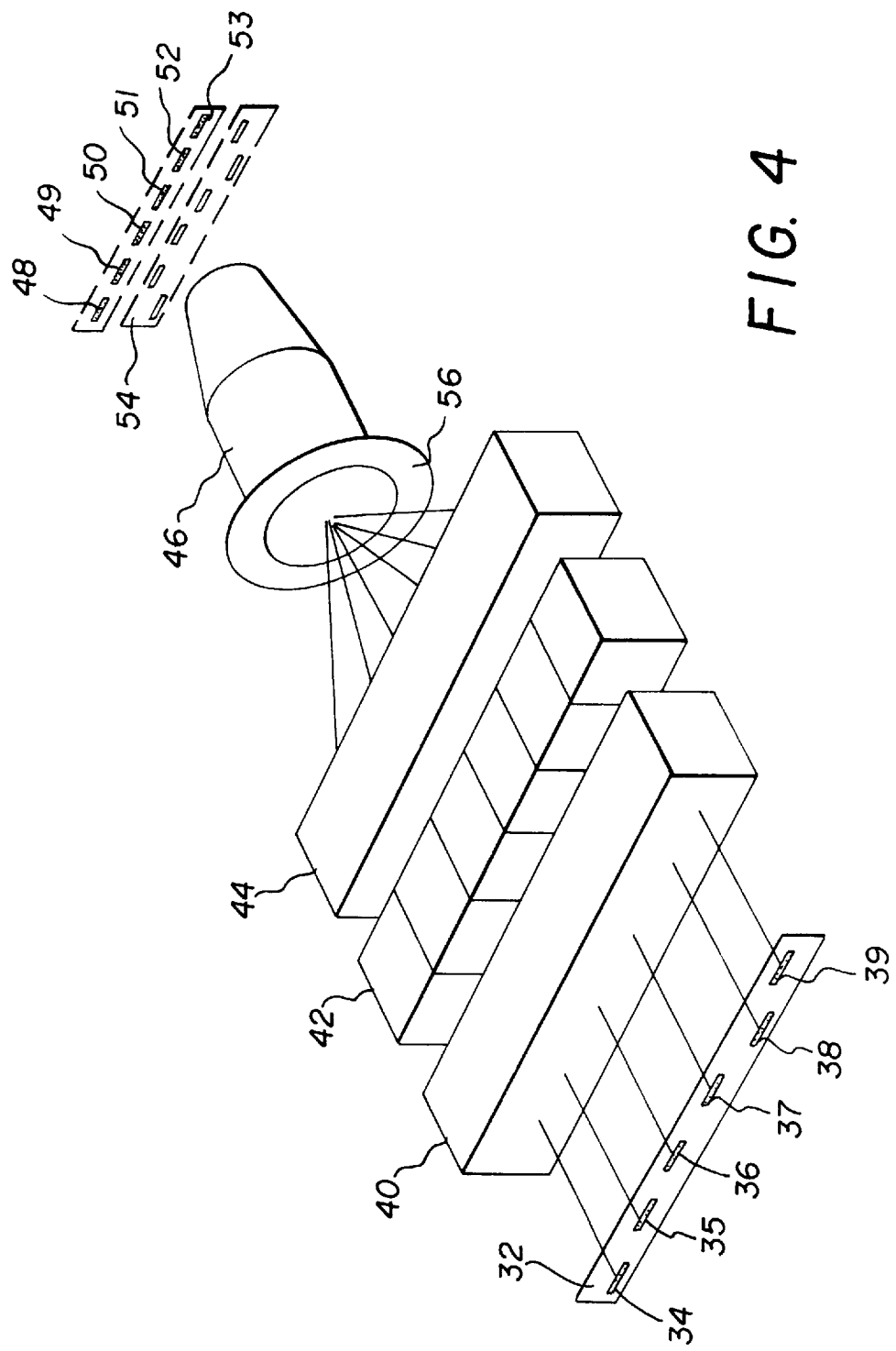
FIG. 4 is a schematic perspective view of a general device for correcting a non-straight laser array according to the present invention.

FIG. 4 shows an example of a printing head which is designed in accordance with the present invention. Laser diode array 32 is made of laser emitters 34 to 39 displaced in the cross-array direction from the ideal straight line by cross-array emitter position errors. Collection and shaping optics 40 directs the light to a corrector 42 which corrects for the non straightness. The corrected beams propagate through shaping optics 44 and a printing lens 46. With the correction, printing spots 48 to 53 at a media plane lie on a straight line. Without correction, the printing spots would not lie in a straight line, as illustrated at 54 in FIG. 4.

Typically, the beam size at an emitter is only about 1 micron in the cross-array direction. Typical beam sizes at the media plane are about 10 microns so as to print at the high resolutions needed in graphic arts of about 2500 dots per inch. Thus, in a system as shown in FIG. 4, where the emitter is conjugated to the media in the cross-array direction, the magnification "m" between the emitter and the media is equal to ten. The cross-array emitter position errors at the emitter are also magnified by m. For cross-array emitter position errors of 5 microns at the emitter, the uncorrected printing array 54 will show displacements of 50 microns (5 microns×10).

According to a feature of the present invention, the beams from the emitter array are corrected while the beams still overlap in the cross-array direction at the entrance pupil 56 of printing lens 46. Thus, the corrected beams are indistinguishable from beams from a perfectly straight laser diode array.

Figure 5A:
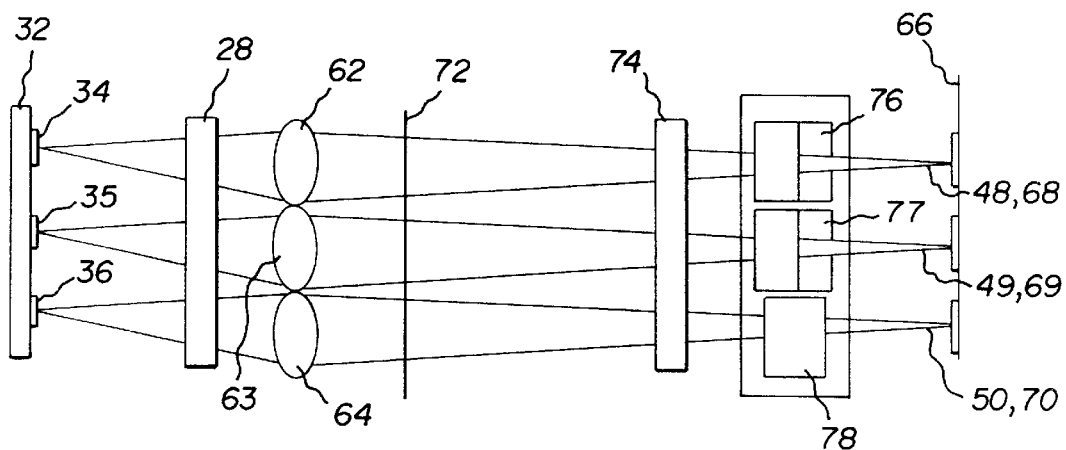
FIGS. 5a and 5b are respectively top and side schematic views of another device for correcting a non-straight laser array according to the present invention.
Figure 5B:
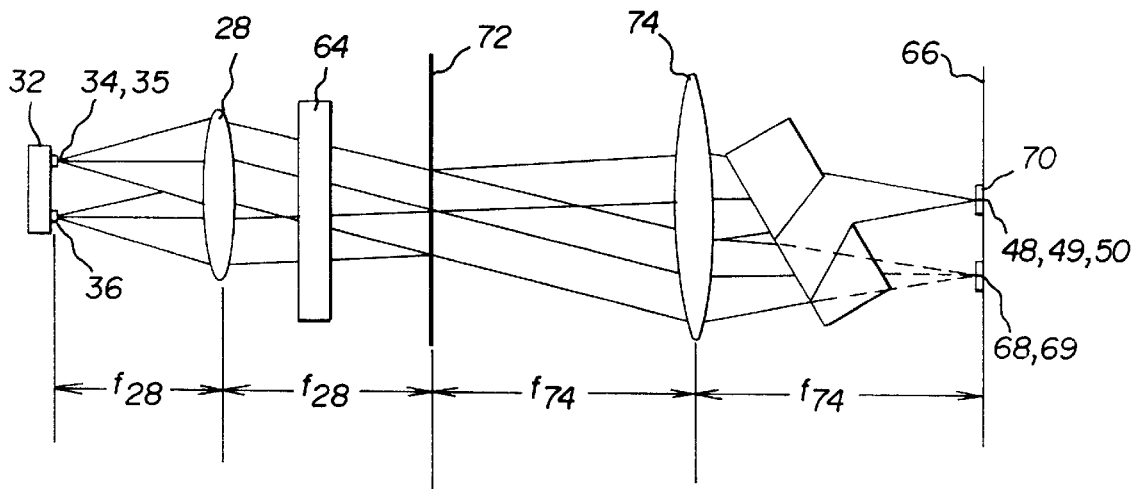

The invention as described with reference to FIGS. 5a, 5b, and 6 corrects fully for the cross-array emitter position errors of a laser diode array 32 having a plurality of diode emitters 34, 35, 36, etc. is shown on FIGS. 5a and 5b in two views. The top view of FIG. 5a shows a cross section in the array direction and FIG. 5b shows a cross-array direction cross section. Only two emitters positions are shown in FIG. 5b, assuming for the purpose of this description that diode 35 is displaced in the cross-array direction by the same mount as diode 34 and thus they overlap in this view. A lens 28 with power in the cross-array direction collects the light emitted by the laser diode array.

An array of lenslets 62 to 64 having power in at least the array direction. Each lenslet receives the light from the corresponding emitter 34, 35, or 36, and images the emitter onto a plane 66 to form the uncorrected printing spots 68 to 70 as shown on FIG. 5b. In any intermediate plane between plane 66 and lenslets 62 to 64, the beams from the different diode lasers are distinguishably separable in the array direction as shown in FIG. 5a.

Plane 72 is the back focal plane of lens 60. The line at the center of the beams from the different emitters intersect at plane 72 as shown in FIG. 5b. It is a general property of a lens to intercept parallel rays at its back focal plane. Thus, the array of beams from a straight line in plane 72 since they overlap in the cross-array direction but are separable in the array direction. Plane 72 could also precede lenslets 62 to 64.

A lens 74 has power in the cross-array direction and, together with lens 28, forms the image of emitter array 32 onto plane 66. The combined system of lenses 28 and 74 is afocal in the cross-array direction and therefore doubly telecentric in the cross-array direction.

The beams are perpendicular both to the emitting surfaces of the emitters and to plane 66. In its simplest form, the distance between the emitter and lens 28 is given by the focal length $f_{28}$ of lens 28, and the distance between lens 28 and plane 72 is also $f_{28}$. The distance between plane 72 and lens 74 is equal to the focal length $f_{74}$ of lens 74, and the distance between lens 74 and plane 66 is also $f_{74}$.

Plane 66 is thus conjugated to the plane of the emitter surface of laser diode array 32. Any cross-array emitter position errors will be clearly observable at plane 66 without the presence of corrector 42 (FIG. 4), to be fully discussed below. Emitters 34 and 35 will be imaged at 68 and 69, respectively, and emitter 36 will be imaged at 70. The cross-array emitter position error of the emitter is magnified at plane 66 by a factor "m", where:

$$m = f_{74}/f_{28}.$$

According to a feature of the present invention, an array of plane parallel plates 76, 77, and 78 is used to fully correct for the cross-array emitter position errors. Each of the plane parallel plates 76 to 78 is an independently tilted plane parallel plate of thickness "t." When tilted by an angle Θ, a plane parallel plate displaces the beam by an amount "s" given by:

$$s = t * \{1 - [\cos(\Theta)/\sqrt{n^2 - \sin^2(\Theta)}]\}$$

Figure 1:
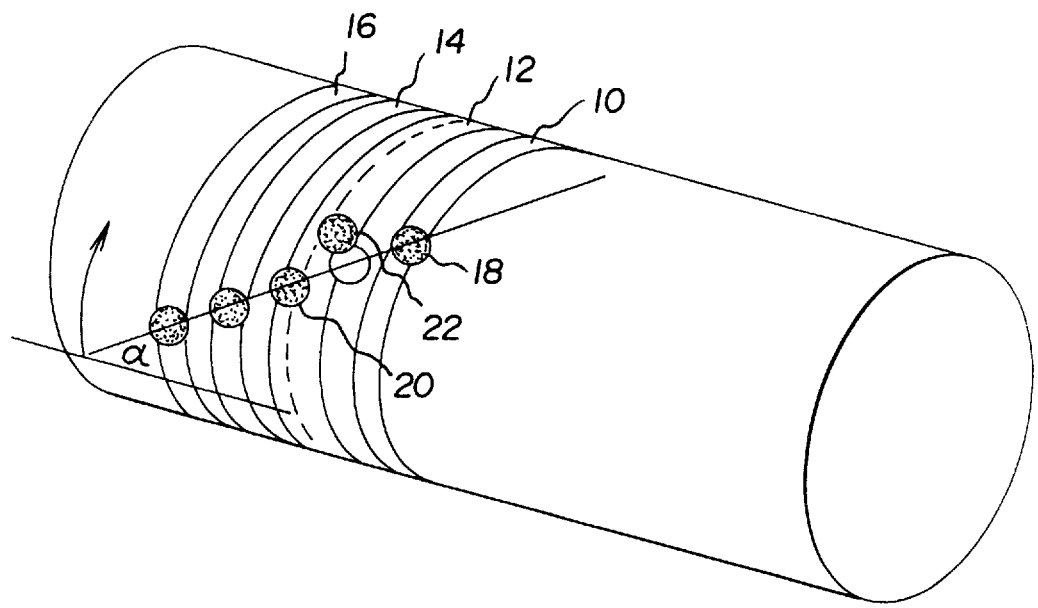
FIG. 1 is a view of a printing drum imaged by a laser emitter array according to the prior art.
Figure 2:
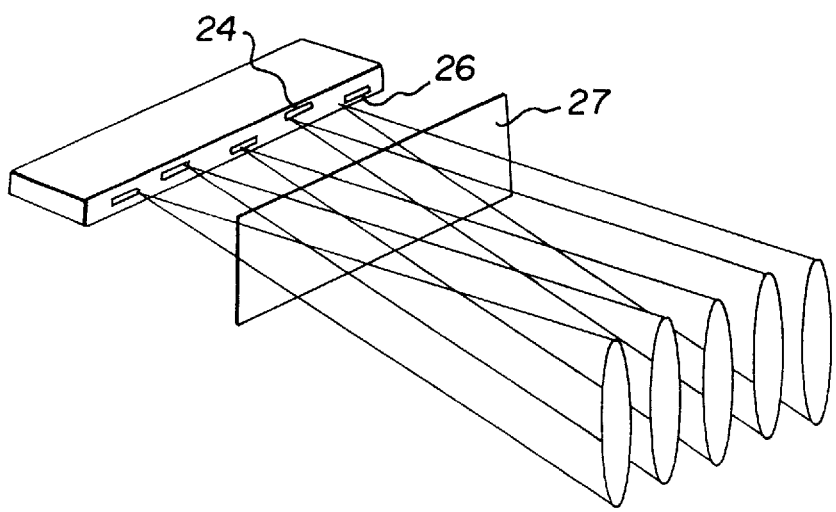
FIG. 2 is a perspective view of a laser and its far field according to the prior art.
Figure 3:
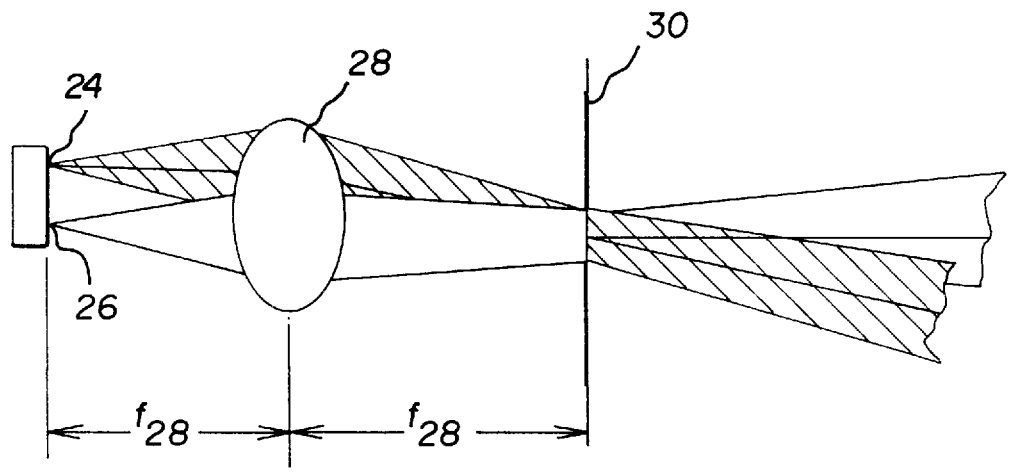
FIG. 3 is a side sectional view of laser straightening in the cross-array direction at the back focal plane of a lens according to the prior art.
Figure 6:
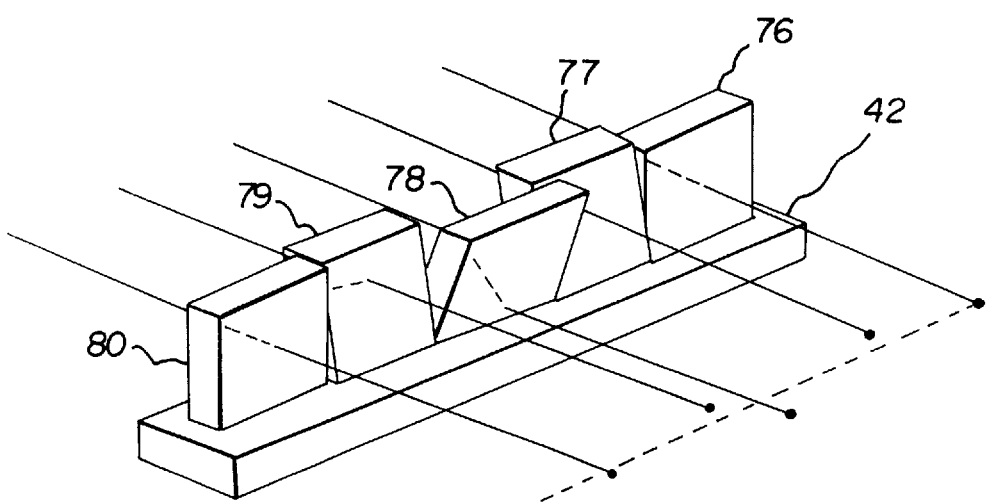
FIG. 6 is a schematic perspective view of a corrector formed of an array of tilted plane parallel plates according to the present invention.

FIG. 6 shows an perspective view of an array of tilted plane parallel plates 76 to 80 (allowing for more emitters than in the prior example). Plane parallel plates 76 to 80 correct the cross-array emitter position error of corresponding emitters of laser diode array 32 by displacing their beams from the un-corrected positions 68 and 69 to the corrected positions at 48 and 49, where they overlap with the laser spot 50 as shown in FIG. 5*b*.

At plane 66 therefore, all the laser spots 48 to 50 overlap. The perpendicularity of the beams was not affected by the plane parallel plates, so the beams are still all perpendicular to plane 66. Thus at plane 66, the laser image is indistinguishable from the image of a perfectly straight laser diode array.

Figure 7C:
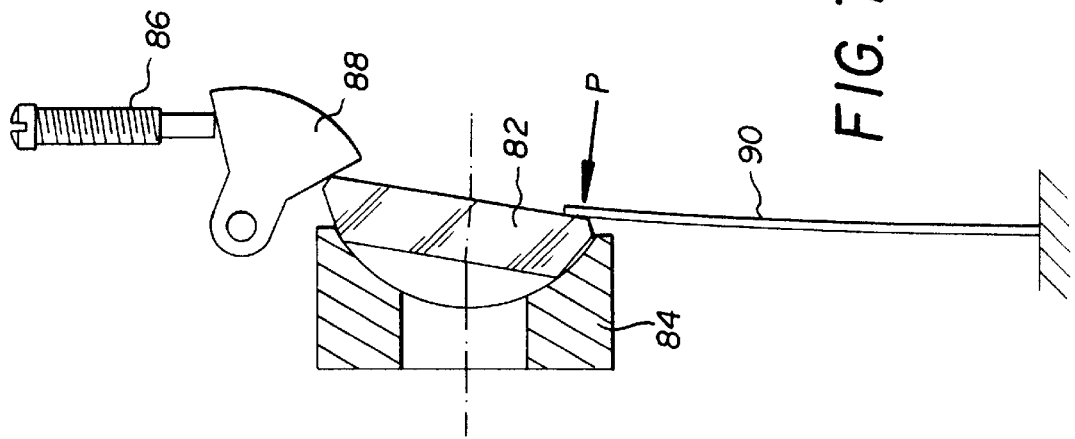
FIGS. 7a to 7c are schematic side sectional views of a structure for correcting a non-straight laser array according to the present invention.
Figure 7B:
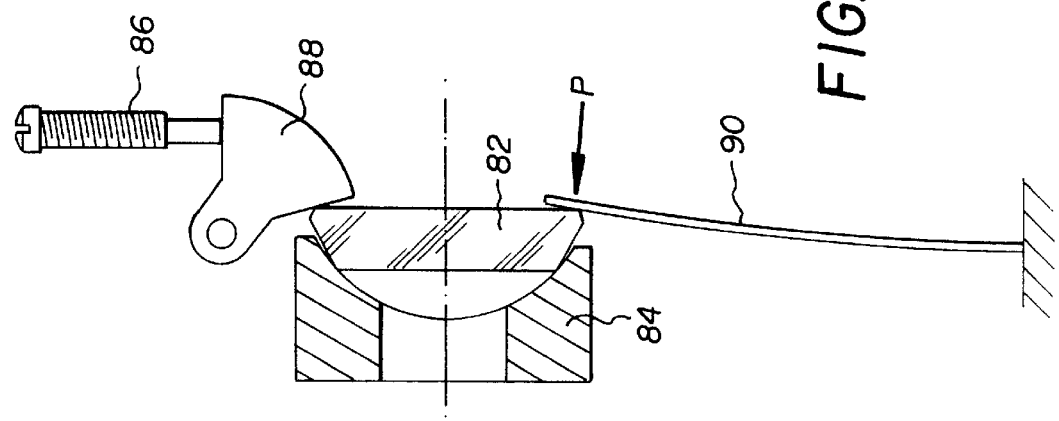
Figure 7A:
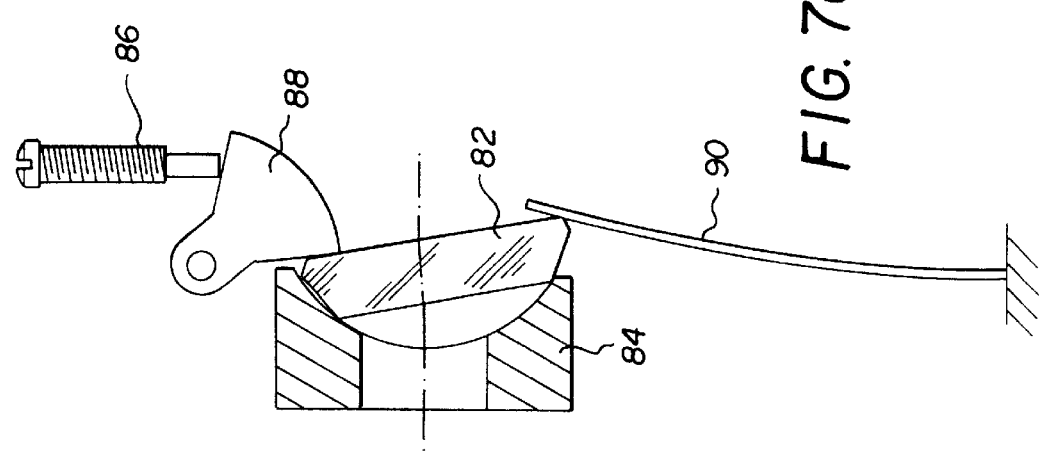

In order to accomplish the needed tilting adjustment of the individual parallel glass plates 76–80, it is necessary to provide additional mechanism. FIGS. 7*a* to 7*c* show a compact optical adjuster device which may be used to effect the small parallel offset corrections to the individual beams of the multi-beam array.

Plane parallel plates, in the form of glass flat 82, are loosely nested in a semi-cylindrical-shaped tray 84. The tilt of the glass flat is then set by an adjustment screw 86 working through a lever 88 against the force "P" of a small leaf spring 90. The opposed end of the glass flat are chamfered to facilitate the necessary sliding contact between the glass and the tray surface, which occurs when adjusting screw 86 is turned.

Figure 8:
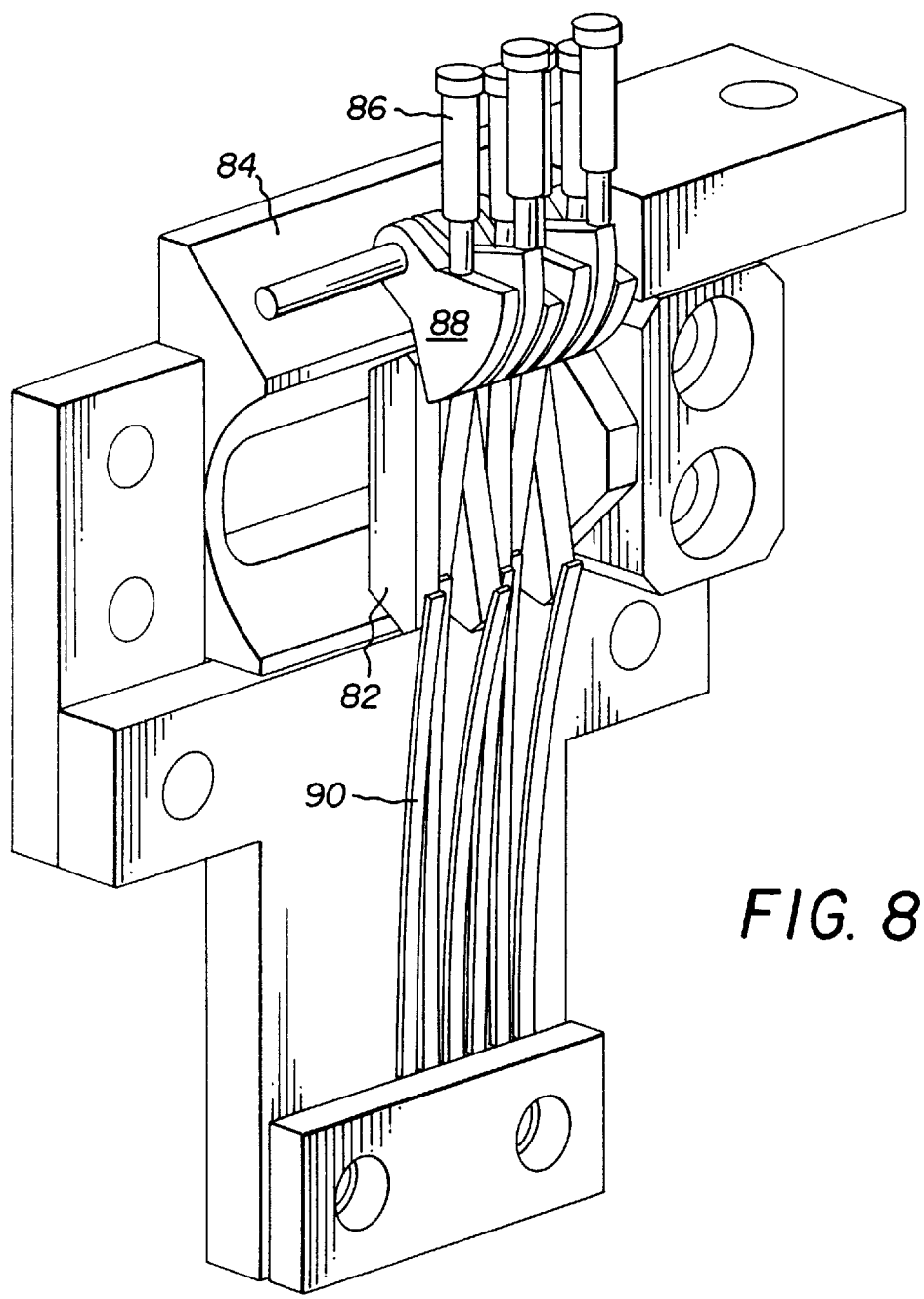
FIG. 8 is a schematic perspective view of the device of FIGS. 7a to 7c.

Referring to FIG. 8, a plurality of glass flats 82 are nesting in an elongated tray 84; one glass flat for each light beam in the array. Each flat 82 has an associated adjustment screw 86, lever 88, and leaf spring 90. Six sets of flats, screws, levers, and springs are shown, and space is provided for additional sets.

Once all of the adjustments have been made, the glass flats can be glued in place in the tray. Screws 86, levers 88, and springs 90 can then be removed and reused.

Figure 9:
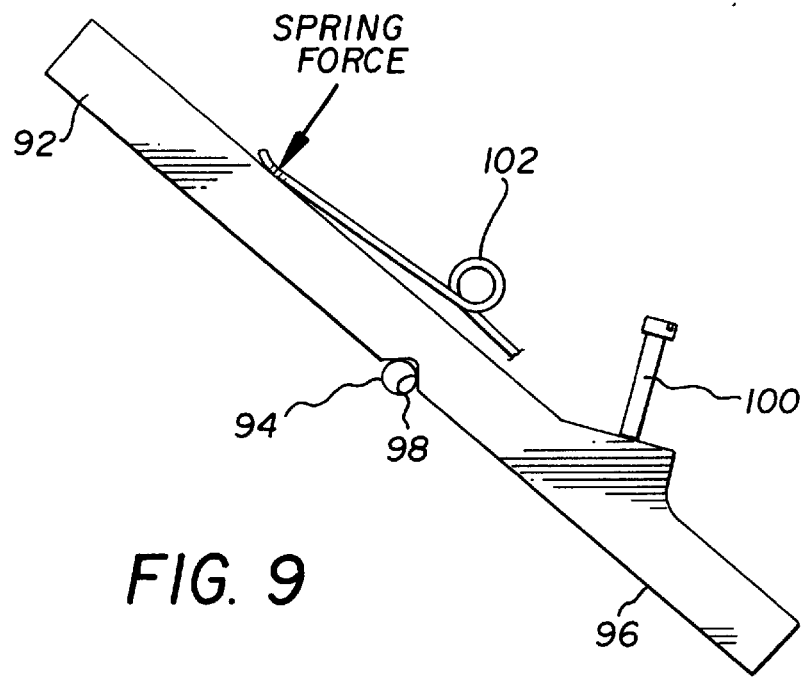
FIG. 9 is a side schematic view of a portion of another embodiment of a device for correcting a non-straight laser array according to the present invention.
Figure 10:
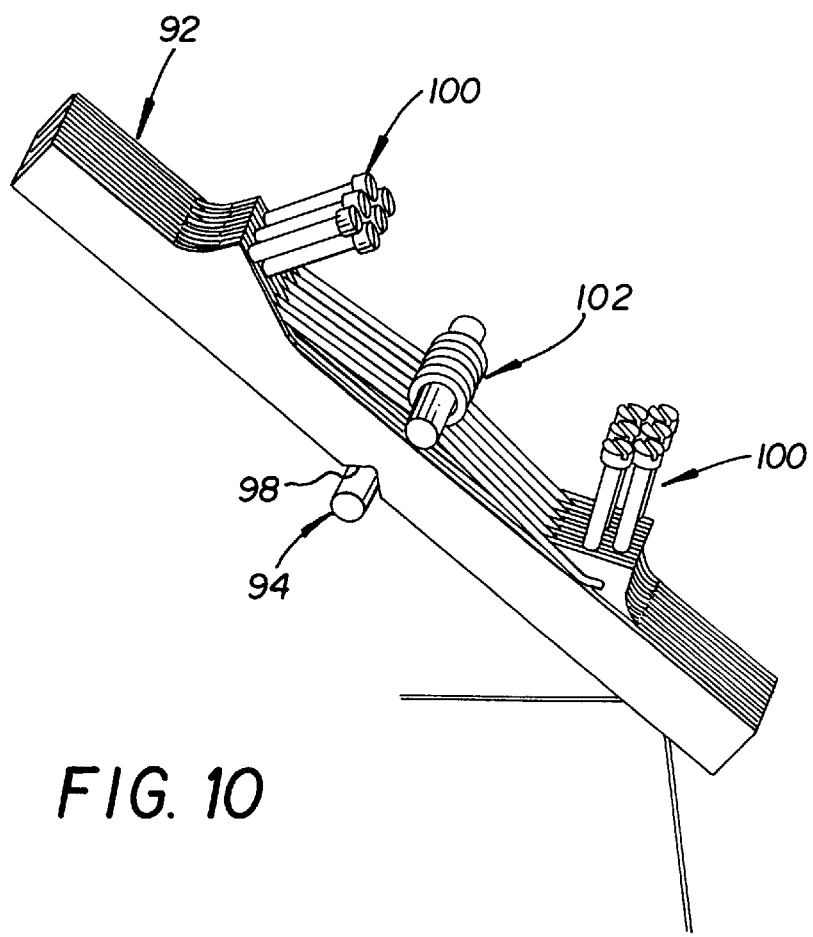
FIG. 10 is a perspective view of the portion of the device of FIG. 9.
Figure 11:
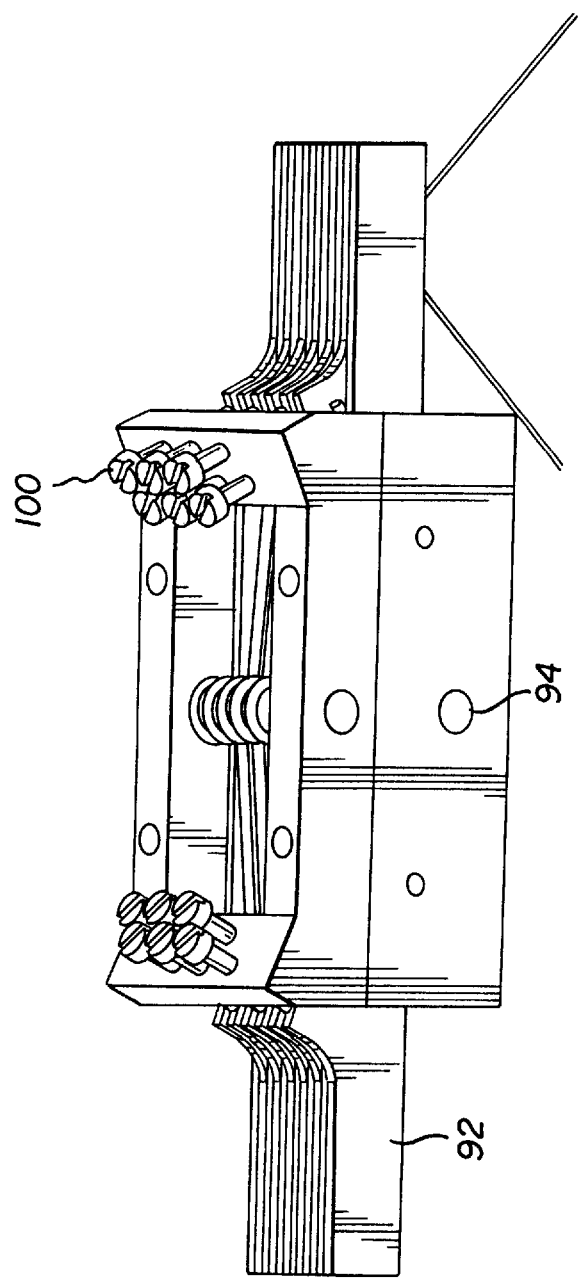
FIG. 11 is a perspective view of the portion of the device of FIGS. 9 and 10, shown with a mounting structure.

FIGS. 9 to 11 show another embodiment of a compact optical adjuster device which may be used to effect the small parallel offset adjustments needed to provide correction of the cross-array position errors of the emitters. While the previously-described embodiments are refractive in nature, utilizing a plurality of small glass flats that are individually tiltable for the purpose of straightening a array of light beams, the embodiment of FIGS. 9 to 11 is reflective in nature and uses a stack of thin mirrors 92.

Mirrors 92 are individually tiltable about a pivot pin 94. The mirrors may be produced by polishing and gold plating a small portion 96 of the surface of each of a stack of levers. Each lever has a V-shaped notch 98 which nests on pivot pin 94 such that the levers may rotate about the pin.

The precise position of each lever about the axis of the pin is individually controlled and set by an adjustment screw 100, one of which is provided for each lever. Because the levers are so thin, there is not sufficient space to position the screw side-by-side; even if the smallest screws are used. Therefore, the screws are staggered, half located on one side of pivot pin 94 and the other have on the other side of the pin. Even with this staggered configuration, adjustment screws in each group are still quite close; so the screws in each group are also staggered.

Small wire springs 102 apply a force to the levers. This force both nests the V-shaped notch of the lever against the pin and maintains the lever in physical contact with the end of the adjusting screw. Each spring applies this force to two adjacent levers.

Figure 12A:
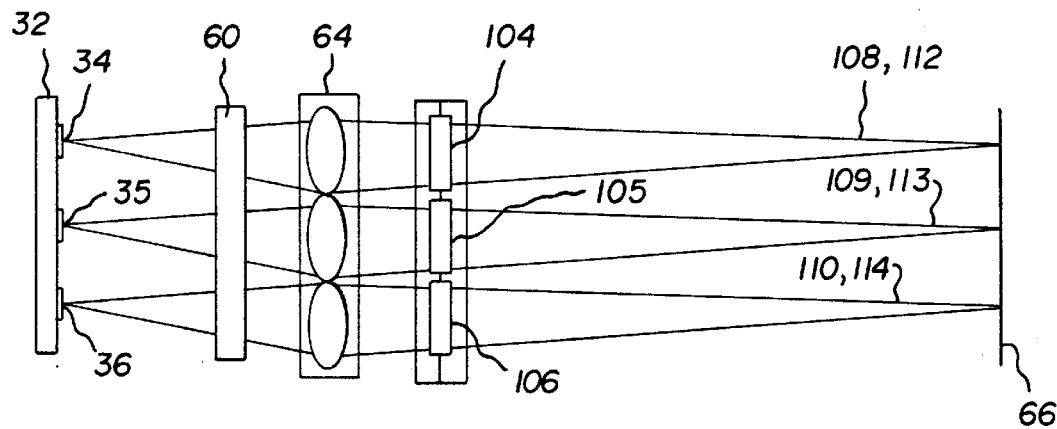
FIGS. 12a and 12b are respectively top and side schematic views of another device for correcting a non-straight laser array according to the present invention.
Figure 12B:
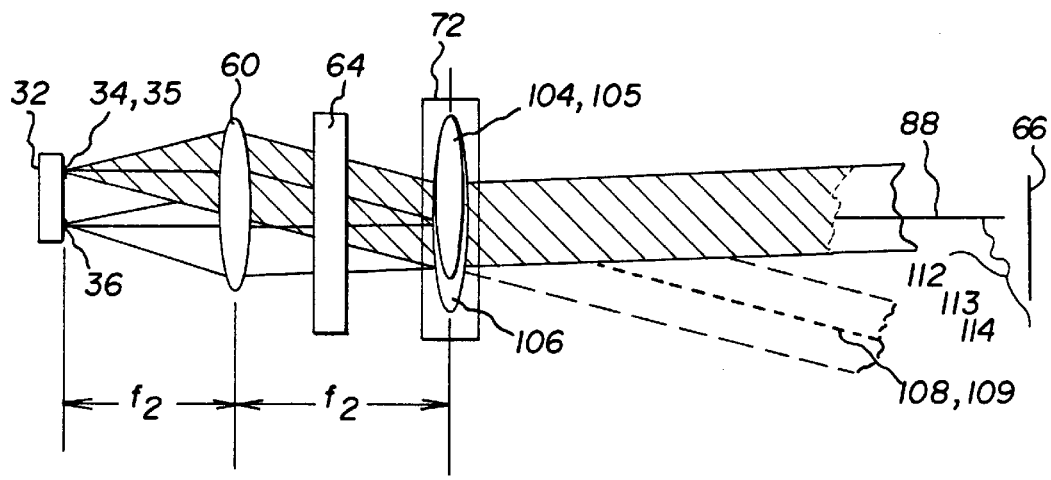

Another preferred embodiment is shown in FIGS. 12*a* and 12*b*. Laser diode array 32 and lens 60 and lenslet array 64 are as described with respect to FIG. 5. In this embodiment, an array of lenslets 104 to 106 is positioned at plane 72 with power in at least the cross-array direction such that each lenslet in the array corresponds to an emitter. The lenslets are displaced in the cross-array direction to correct for the angular errors of the beams at this plane.

For example, if the cross-array emitter position error for, say, emitter 34 is $\epsilon_a$, then the angular error at plane 72 is given, as shown above, simply by $\epsilon/f_{28}$. To correct this angular error, the lenslet 106 has to be displaced by an amount $\epsilon_a$ a such that:

$$\delta_a/f_a = \epsilon/f_{28}$$

Where $f_a$ is the focal length of the lenslets array in the cross-array direction.

Lenslets 104 to 106 also change the convergence of the beams in the cross-array direction, in addition to correcting the angular errors. If this divergence change is undesirable, it can be easily canceled by a stationary compensator lens, not shown, to cancel for the power of lenslets 104 to 106. Thus if a lenslet has a focal length of 12 mm, the compensator lens will have a focal length of –12 mm.

The lenslets correct the angular errors of beams 108 and 109 by displacing lenslets 104 and 105 to direct thereby the beams into the corrected directions 112 and 113, where they overlap with the laser beam 110, 114 as shown in FIG. 12*b*.

Beyond plane 72, laser beams 104 to 106 overlap in the cross-array direction. Thus, at plane 66 and beyond, the laser beams are indistinguishable from the those of a perfectly straight laser diode array.

Note also that, instead of using the displaced lenslets 104 to 106 at plane 72, one could equivalently replace the lenslets with mirrors which are each tilted to correct the beams angular errors at plane 72.

Figure 13:
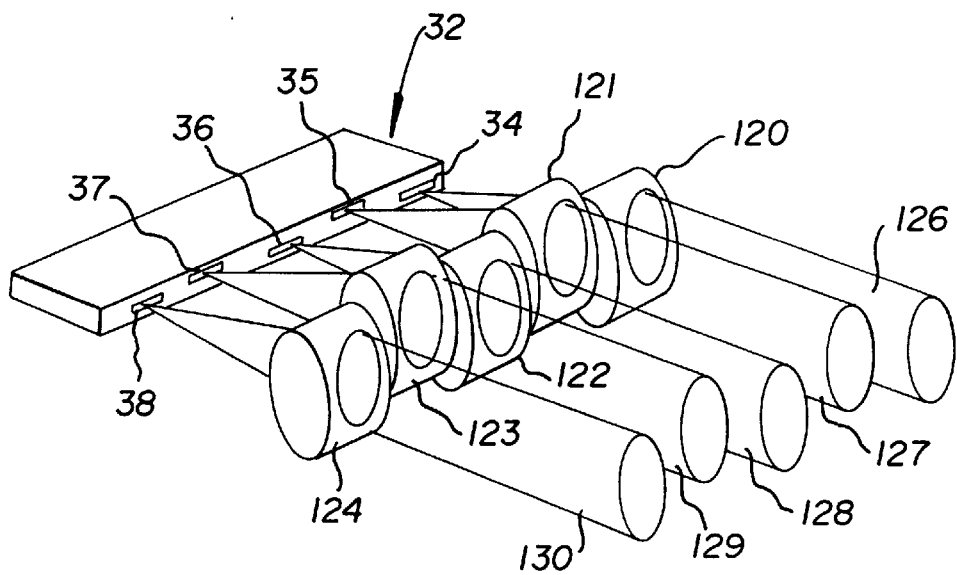
FIG. 13 is a schematic perspective view of another embodiment of a device for correcting a non-straight laser array according to the present invention.

Another embodiment according to this invention is shown in FIG. 13. Here, the cross-array emitter position error of laser diode array 32 is corrected by segmenting a cylinder lens into segments 120 to 124 in correspondence to emitters 34 to 38 of laser diode array 32. The segments can be displaced in the cross-array direction by an amount equal to the cross-array emitter position errors. Lens segments 120 to 124 can be a fiber lens with a round cross section; a VPS lens, which is made by Blue Sky company and has an hyperbolic front surface; or what is called a Doric lens, which is a fiber lens with a gradient index made by Doric Lenses Inc. The beams at lens segments 120 to 124 are much larger than the beam sizes at the emitters. For example, if lens segments 120 to 124 are 140 micron diameter fiber (D=140 microns) with n, the index of refraction, equal to 1.6, the focal length is given by f=nD/4(n−1), or 93 microns. The beam size "S" at the fiber is given by:

$$S = f * 2 * \sin(\Theta/2)$$

where $\Theta$ is the full width at half the maximum divergence of the emitter in the cross-array direction. For full width at half the maximum equal 30°, the beam size at segments 120 to 124 is therefore 48 microns.

Spots 126 to 130 are still displaced by the typical cross-array emitter position error of 5 microns, but this error is now only abut 10% of the beam size, whereas at the emitter, the same errors are five times the beam size.

Figure 14:
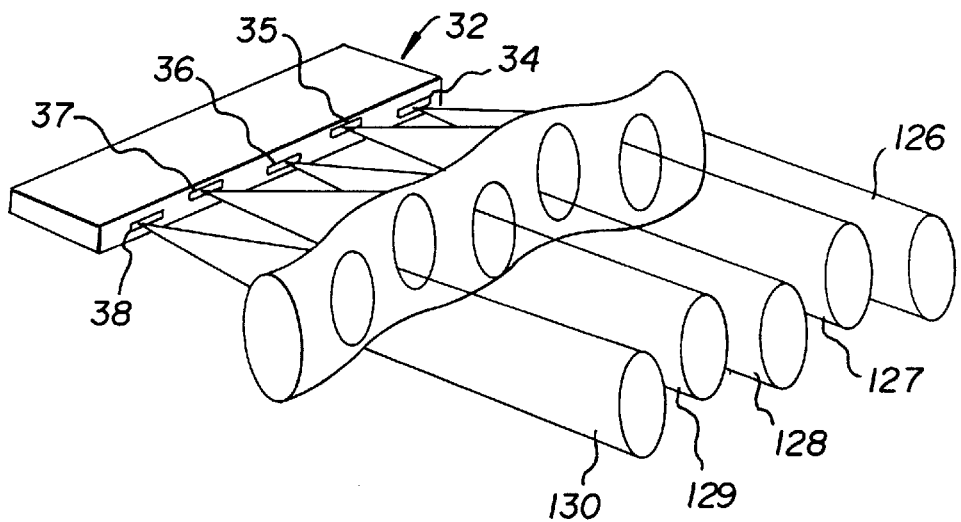
FIG. 14 is a schematic perspective view of another embodiment of a device for correcting a non-straight laser array according to the present invention.

Note that complete segmentation is not needed. The displacements are commonly quite small, on the order of 5 microns. If the fiber lens has a diameter of, say, 140 microns, it can be flexible enough to allow a segment of typically 800 microns long to be pushed up or down by 5 microns. Bending the fiber as shown in FIG. 14 is also a possibility.

Advantages of the Invention

The current invention provides full correction of the cross-array emitter placement errors of laser emitters of a laser bar so that the performance of a printing head will be essentially equivalent to the performance achieved with a perfectly straight emitter array. This correction goes beyond methods which only provide a straight array only at one plane. The presently disclosed invention will greatly reduce light losses and provide maximum depth of focus.

The present invention applies to both a laser bar as disclosed in application Ser. No. 07/986,207 and to bars used with modulators as in application Ser. No. 08/261,370. Also the invention is applicable in other uses of laser bars where it is important to reduce the Lagrange Invariant or the Entendue or equivalently to increase the brightness of the usable light from laser bars in such cases as coupling laser light from bars to fibers such as where the laser bars are used as pumping sources for other laser emitters.

The invention has been described in detail with particular reference to preferred embodiments thereof, but it will be understood that variations and modifications can be effected within the spirit and scope of the invention.

What is claimed is:

1. An optical apparatus for correcting deviations from straightness of an array of laser emitters, said apparatus comprising:

an array of laser emitters in generally aligned positions along an array direction, the positions of the emitters deviating from a straight, array direction line in a cross-array direction perpendicular to the array direction, each laser emitter producing a beam of light in a direction normal to the array and the cross-array directions such that the light beams travel along individual light beam paths;

adjustable corrector means in the light beam paths for aligning the light beam paths in a cross-array direction, thereby to correct for any deviation of the laser emitters from the straight, array direction line of the laser emitters; and wherein the corrector means includes an array of lenslets, each lenslet of the array being associated with a respective one of the beams and being movable in the cross-array direction in the path of the associated beam so as to displace the associated beam by an amount to align the beam paths in a cross-array direction, thereby to correct for any deviation of the laser emitters from the straight, array direction line of the laser emitters.

2. An optical apparatus as set forth in claim 1 wherein the lenslets are movable by displacement in the cross-array direction.

3. An optical apparatus for correcting deviations from straightness of an array of laser emitters, said apparatus comprising:

an array of laser emitters in generally aligned positions along an array direction, the positions of the emitters deviating from a straight, array direction line in a cross-array direction perpendicular to the array direction, each laser emitter producing a beam of light in a direction normal to the array and the cross-array directions such that the light beams travel along individual light beam paths;

adjustable corrector means in the light beam paths for aligning the light beam paths in a cross-array direction, thereby to correct for any deviation of the laser emitters from the straight, array direction line of the laser emitters;

wherein the corrector means includes a small diameter rod lens parallel to the array direction;

wherein the rod lens defines a front focal plane; and the array of laser emitters is positioned at the front focal plane of the rod lens.

4. An optical apparatus for correcting deviations from straightness of an array of laser emitters, said apparatus comprising:

an array of laser emitters in generally aligned positions along an array direction, the positions of the emitters deviating from a straight, array direction line in a cross-array direction perpendicular to the array direction, each laser emitter producing a beam of light in a direction normal to the array and the cross-array directions such that the light beams travel along individual light beam paths;

adjustable corrector means in the light beam paths for aligning the light beam paths in a cross-array direction, thereby to correct for any deviation of the laser emitters from the straight, array direction line of the laser emitters;

wherein the corrector means includes a small diameter rod parallel to the array direction;

further comprising means for forcibly distorting the rod lens in the cross-array direction in the path of the associated beam so as to displace the associated beam by an amount to align the beam paths in a cross-array direction, thereby to correct for any deviation of the laser emitters from the straight, array direction line of the laser emitters.

5. An optical apparatus for correcting deviations from straightness of an array of laser emitters, said apparatus comprising:

an array of laser emitters in generally aligned positions along an array direction, the positions of the emitters deviating from a straight, array direction line in a cross-array direction perpendicular to the array direction, each laser emitter producing a beam of light in a direction normal to the array and the cross-array directions such that the light beams travel along individual light beam paths;

adjustable corrector means in the light beam paths for aligning the light beam paths in a cross-array direction, thereby to correct for any deviation of the laser emitters from the straight, array direction line of the laser emitters;

shaping optics between the array of laser emitters and the corrector means to direct the light of individual emitters to individual associated regions of the corrector means; and wherein the shaping optics is an array of lenslets having power in at least the array direction, each lenslet positioned to receive the beam from a corresponding emitter and to image the corresponding emitter onto a plane to form uncorrected printing spots.

6. An optical apparatus as set forth in claim 5 wherein the corrector means includes an array of plane parallel plates individually tiltable, wherein each of said plates displaces as associated light beam by an amount to align the light beam paths in a cross-array direction, thereby to correct for any deviation of the laser emitters from the straight, array direction line of the laser emitters.

7. An optical apparatus as set forth in claim 6, wherein the plane parallel plates are hinged along one side, and are adapted to be pivoted about their respective hinged sides.

8. An optical apparatus as set forth in claim 6, wherein the corrector means further includes a semicylindrical-shaped tray adapted to receive the plane parallel plates such that the plates may be positioned at various angular orientations relative to the light beam path.

9. An optical apparatus as set forth in claim 8, wherein the corrector means further includes a plurality of adjusting screws associated with the plane parallel plates and adapted to position the plates at said various angular orientations.

* * * * *